(12) United States Patent
Steffan et al.

(10) Patent No.: US 6,468,815 B1
(45) Date of Patent: Oct. 22, 2002

(54) OVERLAY RADIUS OFFSET SHIFT ENGINE

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/476,582

(22) Filed: Jan. 3, 2000

(51) Int. Cl.[7] .............................. H01L 21/66
(52) U.S. Cl. ........................ 438/14; 364/579
(58) Field of Search ................. 701/96; 359/10; 430/5; 348/118; 382/103; 356/237.2; 700/110; 438/14

(56) References Cited

U.S. PATENT DOCUMENTS

| | | | | |
|---|---|---|---|---|
| 5,631,773 A | * | 5/1997 | Henley | 356/237.2 |
| 5,726,920 A | * | 3/1998 | Chen | 364/579 |
| 5,761,064 A | * | 6/1998 | La | 700/110 |
| 5,801,824 A | * | 9/1998 | Henley | 356/237.2 |
| 5,801,965 A | * | 9/1998 | Takagi | 364/552 |
| 5,862,055 A | * | 1/1999 | Chen | 364/468.28 |
| 6,091,846 A | * | 7/2000 | Lin | 382/145 |
| 6,140,182 A | * | 10/2000 | Chen | 438/259 |
| 6,238,940 B1 | * | 5/2001 | Steffan | 438/14 |

* cited by examiner

Primary Examiner—John F. Niebling
Assistant Examiner—Andre Stevenson
(74) Attorney, Agent, or Firm—H. Donald Nelson

(57) ABSTRACT

A method of reducing the effect of placement errors during defect capture and analysis during the manufacture of integrated devices on semiconductor wafers wherein defects from a current layer are evaluated in relation to defects from previous layers after an oversized overlay map has been utilized to perform a best-fit analysis of current defects and previous defects, the oversized overlay map reduced and a trend analysis performed to determine error type and the coordinates of defects translated to their proper location.

10 Claims, 5 Drawing Sheets

OVERLAY RADIUS OFFSET SHIFT ENGINE

BACKGROUND OF THE INVENTION

1. Field of the Invention

This invention relates generally to the manufacture of high performance integrated circuits on semiconductor wafers. More specifically, this invention relates to optimizing the manufacture of high performance integrated circuits on semiconductor wafers. Even more specifically, this invention relates to optimizing the manufacture of high performance integrated circuits on semiconductor wafers by accurately determining the placement errors and reducing the effect of placement errors.

2. Discussion of the Related Art

In the field of defect capture and analysis during the manufacture of integrated circuits on semiconductor wafers, a useful tool for determining the root cause of current layer defects is a method that partitions defects. Partitioning refers to a method of removing defects caught at previous layers from the population of defects at the current layer. It is accomplished by drawing a circle of a given radius around each defect at the current layer and having stacked the current layer with the previous layer's data removing all defects that lie within the circles. This is especially useful for determining equipment related excursions, layer defectivity effects on yield, and layer specific defect issues. Radial based partitioning methodology is well established in a variety of commercial defect and yield data management systems.

In order for partitioning to be effective there must be a high degree of correspondence to defect positioning between several different equipment models and across several manufacturers of defect scanning equipment. Due to a lack of a global alignment marking system, equipment manufacturers have developed a variety of schemes to assign an xy positioning value to caught defects. Typically these schemes are based on the wafer center; other schemes wafer edge or pattern alignments are used. This lack of uniformity of methodology adds error to absolute defect placement. In addition, the inherent inaccuracy of defect placement of dark field scanning tools adds error to positioning.

These placement errors manifest themselves as several different types. There can be offset errors due to scan recipe setup alignment offsets or equipment tool setup offsets or scan stage (wafer holder) offsets. There can be rotational errors due to wafer notch alignment off axis rotational error. In addition, there can be general misplacement error due to equipment error or general lack of equipment precision.

These errors combine to make partitioned data relatively inaccurate, enough so that manufacturing decisions cannot be made reliably with the current data.

Therefore, what is needed is a method of accurately determining the size and direction of these errors and a method of reducing the effects of these errors and offsets during the manufacturing process of semiconductor wafers.

SUMMARY OF THE INVENTION

According to the present invention, the foregoing and other objects and advantages are achieved by a method of reducing the effects of placement errors during defect capture and analysis during the manufacture of integrated devices on semiconductor wafers.

In accordance with an aspect of the present invention, defects from a current layer are evaluated in relation to defects from previous layers.

In accordance with another aspect of the present invention, a placement circle radius is determined by a defect management system based upon expected placement errors.

In accordance with another aspect of the present invention, an oversized overlay map is applied to the current layer defect information.

In accordance with another aspect of the present invention, a best-fit analysis is applied to fit defect data in the placement circles.

In accordance with another aspect of the present invention, the oversized overlay map is reduced to catch defects at a minimum distance.

In accordance with another aspect of the present invention, a trend analysis is performed to determine the type of placement error.

In accordance with another aspect of the present invention, defects are translated to their proper locations.

The described method thus provides a method of accurately determining placement errors and a method of reducing the effects of the placement errors.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 4A shows the production control wafer with defects and placement circles that have been drawn based on a previous scan;

FIG. 4B shows the production control wafer as shown in FIG. 4A with the placement circles oversized such that all defects within the expected error range will be caught;

FIG. 4C shows the production control wafer as shown in FIG. 4B after a best fit analysis; and FIG. 4D shows the production control wafer as shown in FIG. 4C after the oversized placement circles have been reduced to catch only overlay defects at their minimum distance.

DETAILED DESCRIPTION

Reference is now made in detail to a specific embodiment of the present invention that illustrates the best mode presently contemplated by the inventors for practicing the invention.

Figure 1:
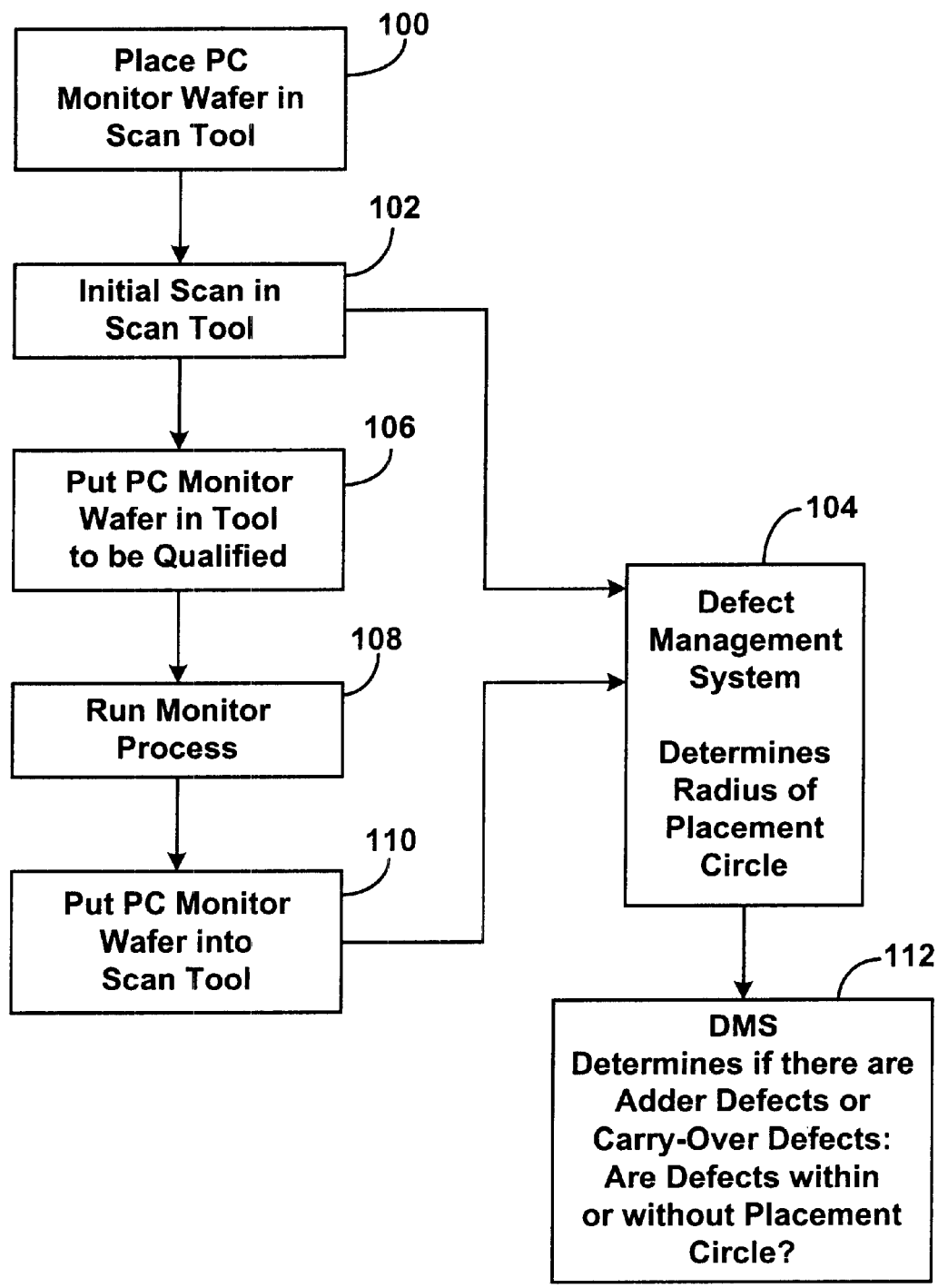
FIG. 1 shows a prior art method for the qualification of a process tool utilized in the manufacture of integrated circuits on a semiconductor wafer.

FIG. 1 shows a prior art method for the qualification of a process tool utilized in the manufacture of integrated circuits on a semiconductor wafer. The method begins at 100 by placing a production control (PC) wafer in a scan tool. The production control (PC) is typically a wafer ostensibly with no defects. The production control wafer is subjected to an initial scan at 102. The defect information caught during the scan is sent to a defect management system (DMS) 104. The defect management system 104 determines the radius of the placement circles based on expected placement errors. These placement errors manifest themselves as several different types. There can be offset errors due to scan recipe setup alignment offsets or equipment tool setup offsets or scan stage (wafer holder) offset, rotational errors due to wafer notch alignment off-axis rotational error. In addition, there can be general misplacement error due to equipment error or general lack of equipment precision. The defect management system predicts these errors and bases the determination of the expected placement errors on these predictions. The expected placement errors are determined either through computer modeling or empirically.

The production control wafer is removed from the scan tool and placed in the tool that is to be qualified at 106. A monitor process is run as indicated at 108. The monitor process may be a modified process or the complete process that is to be run on actual production wafers. The production control wafer is removed from the tool that is to be qualified and placed in a scan tool at 110. The scan tool utilized at 110 is preferably the same scan tool that was used at 102.

Defect information for defects caught in the scan tool at 110 is sent to the defect management system 104. The defect management system 104 determines at 112 if there are adder defects or carry-over defects by determining if there are defects without the previously determined circles (adder defects) or if the defects are within the previously determined circles (carry-over defects). The determination of whether there are adder defects or carry-over defects is not accurate because the method does not compensate or account for placement errors caused by translation of the wafer in either the x or y direction or in both directions or by rotation of the wafer around the center of the wafer. Another placement error is caused by inherent machine errors such as inaccurate tracking of the stage carrying the scan tool over the surface of the wafer.

Figure 2:
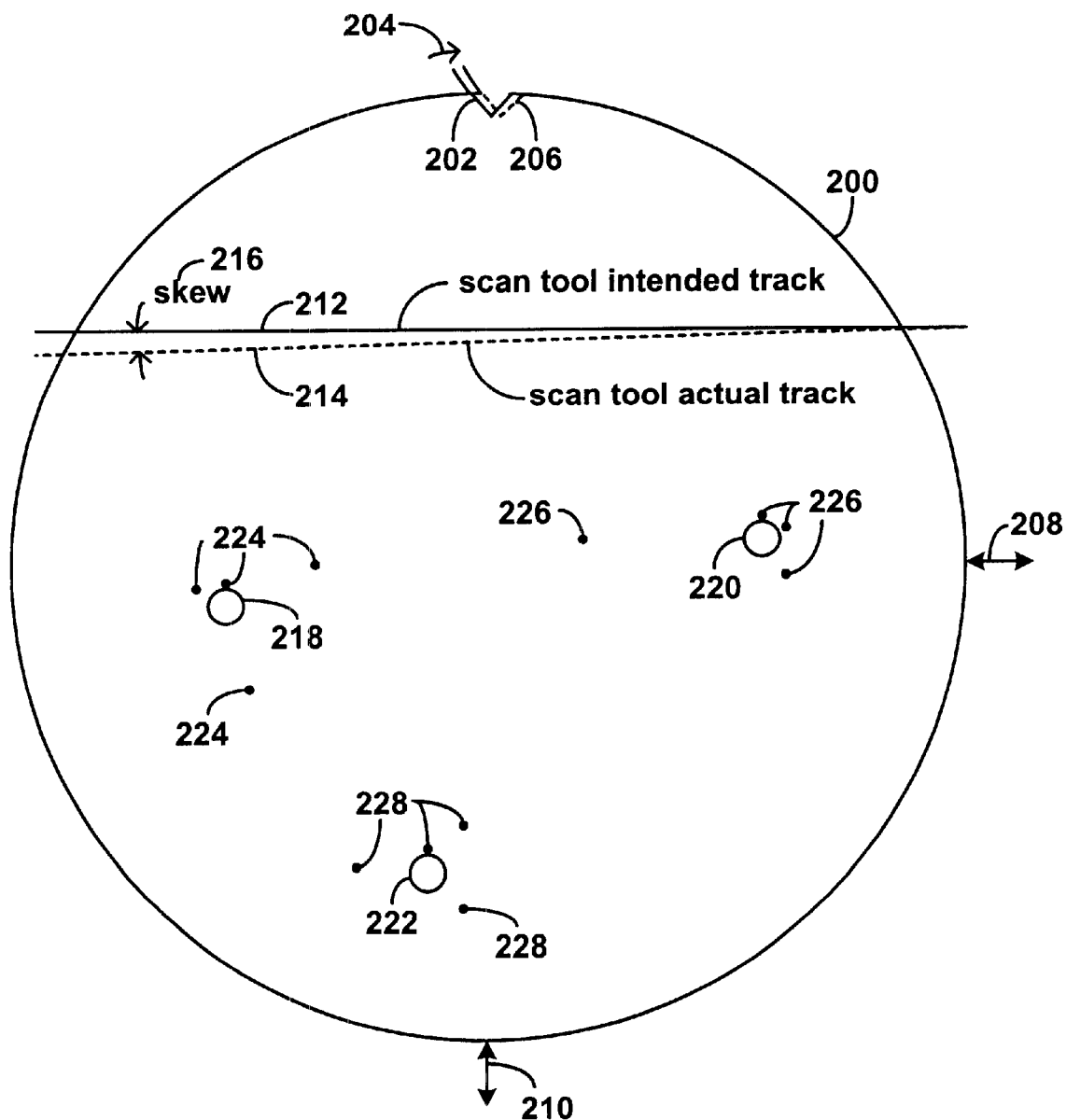
FIG. 2 shows defects on a production control wafer during the qualification of a process tool as described in the method shown in FIG. 1.

FIG. 2 shows a wafer 200, a wafer notch 202 and possible rotation of the wafer, indicated at 204, showing the wafer 200 as rotated from the correct position indicated by the dashed lines 206. The possibility of translation in a first direction is indicated at 208 and the possibility of translation in a second direction orthogonal to the first direction is indicated at 210. The solid line 212 shows the scan tool intended track across the surface of the wafer 200 and the dashed line 214 shows the actual scan tool track across the surface of the wafer 200 resulting in a skew value, indicated at 216. Also shown are three circles 218, 220, and 222 that have been drawn from a previous scan along with defects 224 through 228 that are relatively close to the three circles 218, 220 and 220, respectively. Because there is no method of accounting for or compensating for the placement errors, none of the defects 224, 226 or 228 are shown within the three circles 218, 220 or 220. This would indicate that there are no carry-over defects and that all of the defects caught in the current scan are adder defects. This conclusion may be completely erroneous and would give faulty results.

Figure 3:
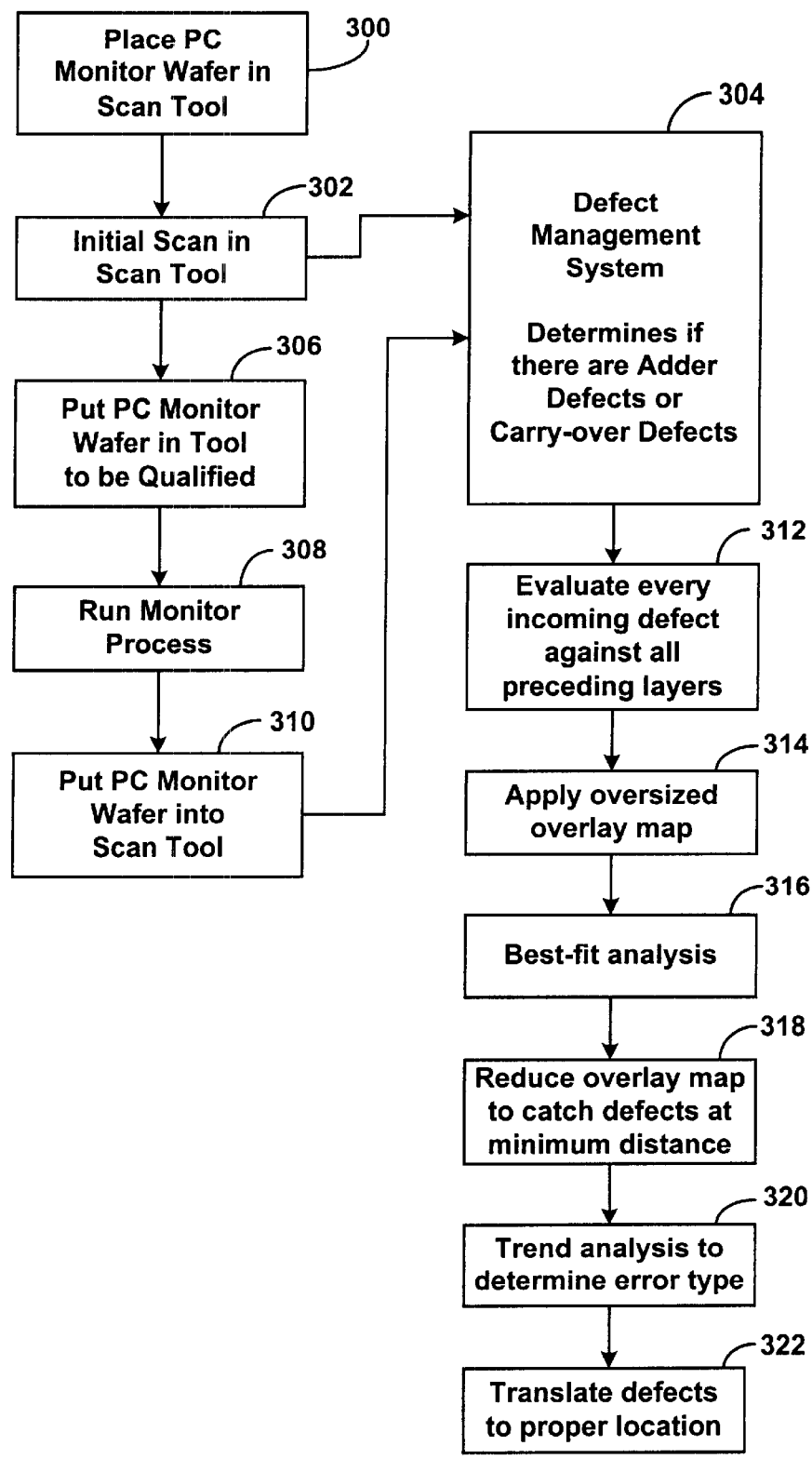
FIG. 3 shows a method for the qualification of a process tool utilized in the manufacture of integrated circuits on a semiconductor wafer in accordance with the present invention.

FIG. 3 shows a method for the qualification of a process tool utilized in the manufacture of integrated circuits on a semiconductor wafer in accordance with the present invention. The method begins at 300 by placing a production control (PC) wafer in a scan tool. The production control (PC) is typically a wafer ostensibly with no defects. The production control wafer is subjected to an initial scan at 302. The defect information caught during the scan is sent to a defect management system (DMS) 304. The defect management system determines the radius of placement circles based on expected placement errors as described above in conjunction with FIG. 1.

The production control wafer is removed from the scan tool and placed in the tool that is to be qualified at 306. A monitor process is run as indicated at 308. The monitor process may be a modified process or the complete process that is to be run on actual production wafers. The production control wafer is removed from the tool that is to be qualified and placed in a scan tool at 310. The scan tool utilized at 310 is preferably the same scan tool that was used at 302.

Defect information for defects caught in the scan tool at 310 is sent to the defect management system 304. The defect management system 304 determines if there are adder defects or carry-over defects. Every incoming defect is evaluated against all preceding layer as indicated at 312 by applying an oversized overlay map as indicated 314. A best fit analysis is conducted as indicated at 316 and after the best fit analysis is completed, the oversized overlay map is reduced, as indicated at 318, to catch defects at the minimum distance as determined by the placement circles determined above at 304. After the best fit analysis and the reduction of the overlay map is finished a trend analysis 320 is conducted to determine the placement error type, that is, whether the placement error is an offset error, a rotation, error, a translation error or skew error. When the type and amount of error is determined, data correction will be conducted as indicated 322 by translating the coordinates of defects to their proper location.

Figure 4A:
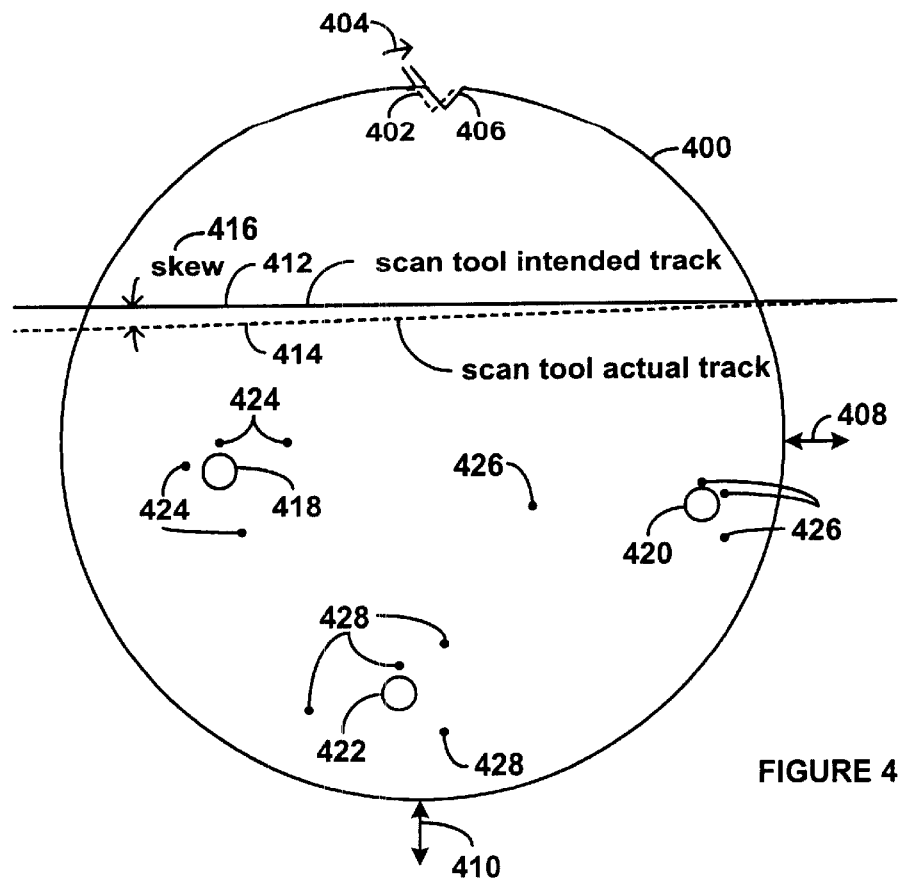
FIGS. 4A–4D shows various states of a production control wafer during the qualification of a process tool as described in the method shown in FIG. 3.

FIGS. 4A–4D show various states of the production control wafer during the qualification of a process tool as described above in conjunction with FIG. 3. FIG. 4A shows a production control wafer 400, a wafer notch 402 and possible rotation of the wafer 400, indicated at 404, showing the wafer 400 as rotated from the correct position indicated by the dashed lines 406. The possibility of translation in a first direction is indicated at 408 and the possibility of translation in a second direction orthogonal to the first direction is indicated at 410. The solid line 412 shows the scan tool intended track across the surface of the wafer 400 and the dashed line 414 shows the actual scan tool track across the surface of the wafer 400 resulting in a skew value, indicated at 416. Also shown are three placement circles 418, 420 and 422 that have been drawn from a previous scan along with defects 424, 426 and 428. As described above, because of placement errors caused by translation of the wafer 400, rotation of the wafer 400 or scan tool skew across the wafer 400, none of the defects are shown within the three placement circles 418, 420 and 422.

Figure 4B:
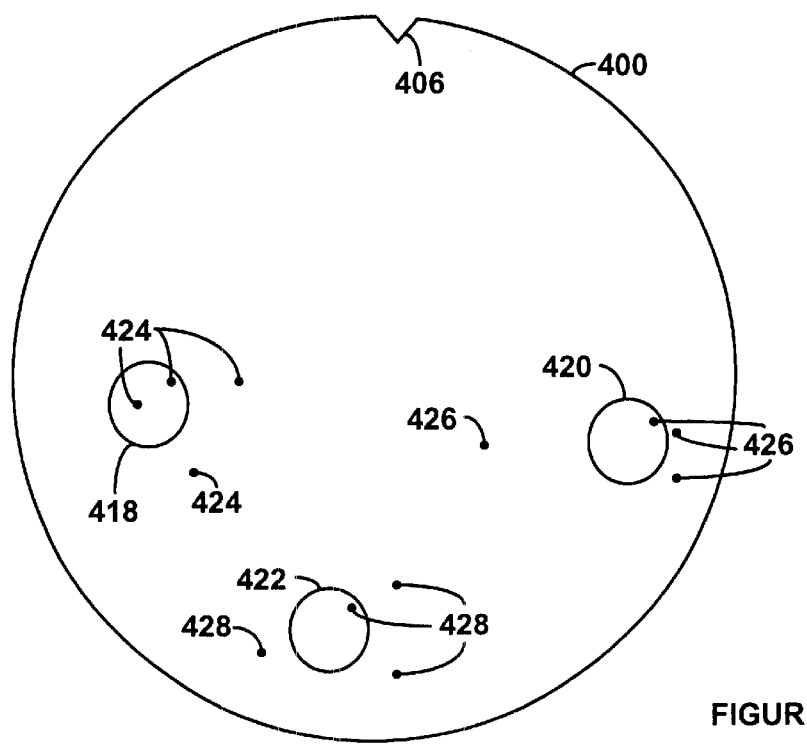

FIG. 4B shows the production control wafer as shown in FIG. 4A with the placement circles 418, 420, and 422 oversized in order that all defects within the expected error range will be within the boundaries of the oversized placement circles.

Figure 4C:
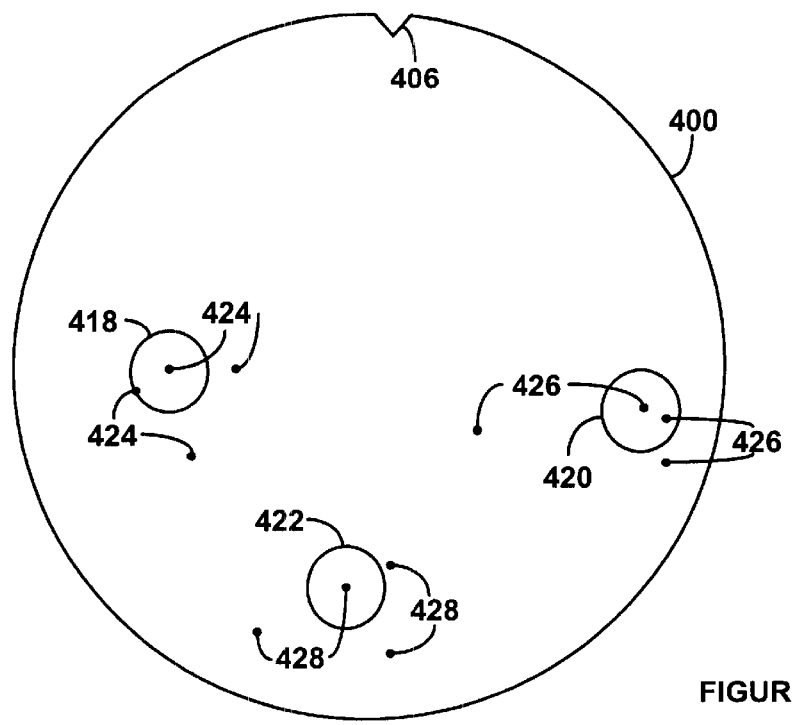

FIG. 4C shows the production control wafer as shown in FIG. 4B after a best-fit analysis has been completed. The best-fit analysis is accomplished by translating and rotating the coordinates of the defects until the best fit of defects within the placement circles 418, 420 and 422 is achieved.

Figure 4D:
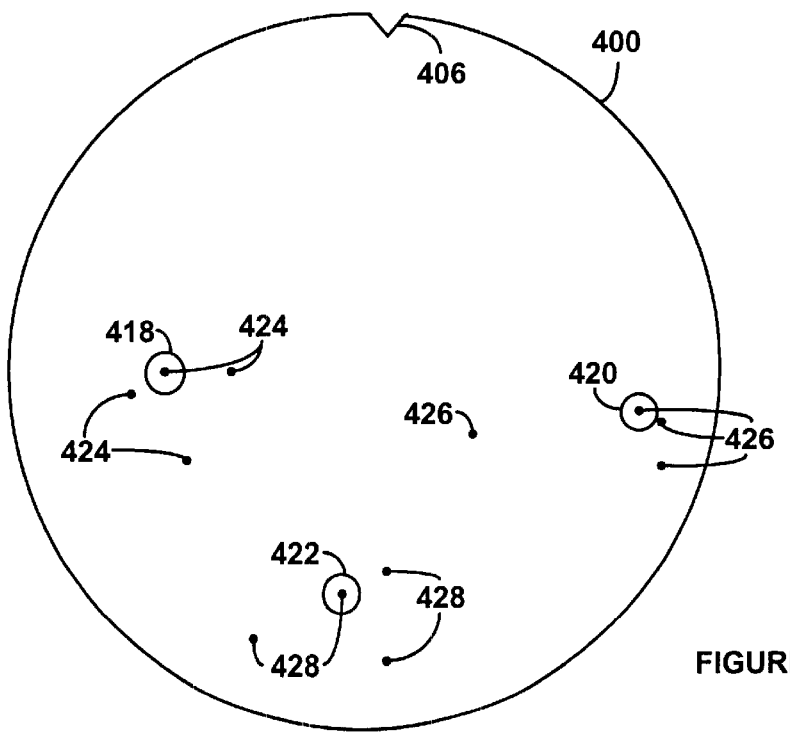

FIG. 4D shows the production control wafer as shown in FIG. 4C after the placement circles have been reduced to their normal size. Shown within the placement circles 418, 420 and 422 are defects that would be considered carry-over defects. The defects shown outside the placement circles 418, 420 and 422 would be considered adder defects.

The benefits of the invention include the following:

1. It will allow overlay of previous layer defects for comparison of delta maps (pre vs. post maps);
2. It will allow for yield analysis using critical area calculation (layer specific) to use data from only that layer;
3. It will aid in tracking equipment or layer level excursions through accurate reporting of current layer defects; and
4. It will allow for ease of defect recapture on downstream defect review tools.

In summary, the present invention overcomes the limitations of the prior art and fulfills the need for a method of accurately determining placement errors and a method of reducing the effects of the placement errors.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of reducing the effect of placement errors during defect capture and analysis during the manufacture of integrated devices on semiconductor wafers, the method comprising:

(a) placing a production control monitor wafer in a scan tool;

(b) doing a first scan of the production control monitor wafer to capture first scan defects;

(c) sending first scan defect information for captured defects to a defect management system;

(d) placing the production control monitor wafer in a process tool;

(e) running a monitor process on the production control monitor wafer;

(f) doing a second scan of the production control monitor wafer to capture second scan defects;

(g) sending second scan defect information for captured defects to the defect management system;

(h) evaluating second scan defect information in relation to first scan defect information in the defect management system to reduce placement errors, wherein the placement errors include wafer rotation misalignment errors, xy translation errors and scan tool tracking errors; and (i) accurately determine adder defects and carry-over defects.

2. The method of claim 1 further comprising (j) evaluating second scan defect information in relation to all previous scan defect information.

3. The method of claim 2 wherein step (h) includes determining a placement circle radius.

4. The method of claim 3 wherein step (h) further includes applying an oversized overlay map to the second scan defect information.

5. The method of claim 4 wherein step (h) further includes performing a best-fit analysis.

6. The method of claim 5 wherein step (h) further includes reducing the oversized overlay map to catch defects at a minimum distance.

7. The method of claim 6 wherein step (h) further includes performing a trend analysis to determine type of placement error.

8. The method of claim 6 wherein step (h) further includes translating defects to proper locations.

9. The method of claim 1 wherein the monitor process in step (e) comprises an abbreviated process.

10. The method of claim 1 wherein the monitor process in step (e) comprises a complete process.

* * * * *